United States Patent
Tsang

(10) Patent No.: US 8,872,229 B2
(45) Date of Patent: Oct. 28, 2014

(54) THIN FILM TRANSISTOR

(75) Inventor: Jian-Shihn Tsang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 30 days.

(21) Appl. No.: 13/528,846

(22) Filed: Jun. 21, 2012

(65) Prior Publication Data

US 2013/0256651 A1    Oct. 3, 2013

(30) Foreign Application Priority Data

Mar. 27, 2012   (TW) ............................ 101110460 A

(51) Int. Cl.
    *H01L 21/336*    (2006.01)

(52) U.S. Cl.
    USPC ....... 257/192; 257/43; 257/194; 257/E29.296

(58) Field of Classification Search
    CPC .................................................. H01L 29/7869
    USPC ................... 257/43, 192, 613, 194, E29.296
    See application file for complete search history.

(56) References Cited

U.S. PATENT DOCUMENTS

2003/0067037 A1*   4/2003   Lu et al. .................... 257/347
2012/0001168 A1*   1/2012   Ichijo et al. .................. 257/43

FOREIGN PATENT DOCUMENTS

JP           11261052 A    *  9/1999

OTHER PUBLICATIONS

Electronic Translation—JP 11-261052.*
Electronic Translation—JP 11-261052 Sep. 1999.*

* cited by examiner

*Primary Examiner* — Jose R Diaz
(74) *Attorney, Agent, or Firm* — Novak Druce Connolly Bove + Quigg LLP

(57) ABSTRACT

A thin film transistor includes a substrate and an active layer formed on the substrate. The active layer includes a channel region, a source region and a drain region. A source electrode and a drain electrode are formed on the source region and the drain region respectively. A gate insulating layer is formed between a gate electrode and the channel region. The thin film transistor further includes a nitride conductive layer formed between the drain electrode and the drain region, and between the source electrode and source region. The nitride conductive layer has a carrier concentration higher than that of the active layer, thereby reducing contacting resistances between the drain electrode and the drain region and between the source electrode and source region.

16 Claims, 3 Drawing Sheets

THIN FILM TRANSISTOR

BACKGROUND

1. Technical Field

The disclosure generally relates to a thin film transistor.

2. Description of Related Art

Nowadays, thin film transistors have been widely used in display devices to make the display devices become thinner and smaller. A typical thin film transistor includes a channel region, and a source region and a drain region formed at two opposite ends of the channel region, respectively. A gate electrode is formed on the channel region. A source electrode and a drain electrode are formed on the source region and the drain region, respectively. The thin film transistor is turned on or turned off by controlling a voltage applied to the gate electrode.

Generally, the source region and the drain region each are made of an oxide semiconductor material such as InGaZnO, which has a carrier concentration ranging from $1\times10^{15}$ to $1\times10^{18}$ $cm^{-3}$. When the source electrode is applied to the source region, a contact resistance between the source electrode and the source region will have a high value due to the relatively low carrier concentration of the source region. Similarly, a contact resistance between the drain electrode and the drain region will have a high value due to a relatively low carrier concentration of the drain region. The high contact resistances will increase a driving voltage of the thin film transistor and reduce a response speed of the thin film transistor to a control signal.

What is needed, therefore, is a thin film transistor to overcome the above described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments of a thin film transistor will now be described in detail below and with reference to the drawings.

Figure 1:
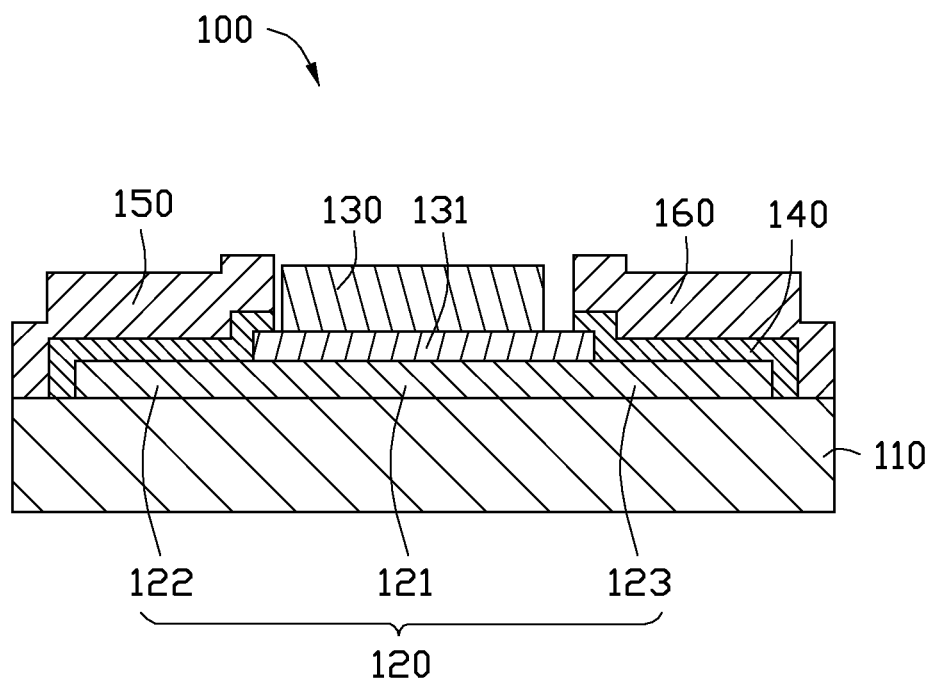
FIG. 1 is a cross-sectional view showing a thin film transistor in accordance with a first embodiment of the present disclosure.

Referring to FIG. 1, a thin film transistor 100 in accordance with a first embodiment includes a substrate 110, an active layer 120 formed on the substrate 110, a gate electrode 130, a nitride conductive layer 140, a source electrode 150 and a drain electrode 160.

The substrate 110 is made of a material selected from a group consisting of glass, quartz, silicone, polycarbonate, polymethyl methacrylate and metal foil.

The active layer 120 is formed on an upper surface of the substrate 110. The active layer 120 includes a channel region 121, a source region 122 and a drain region 123 formed on two lateral portions of the channel region 121. The active layer 120 is made of an oxide semiconductor material selected from a group consisting of IGZO, ZnO, TiOx, GTO, GZO, AZO, IZO, ITO, ATO, $In_2O_3$, and $SnO_2$. In this embodiment, the active layer 120 is made of IGZO.

The gate electrode 130 is located above the channel region 121, and a gate insulating layer 131 is formed between the gate electrode 130 and the channel region 121. When the thin film transistor 100 is in use, voltages applied to the gate electrode 130 will control working states of the thin film transistor 100. For example, for an enhanced thin film transistor 100, when the gate electrode 130 is applied with a voltage greater than a threshold voltage of the thin film transistor 100, an electrically conductive channel will be formed in the channel region 121 to connect the source region 122 with the drain region 123, and the thin film transistor 100 is in an "on" state. When the gate electrode 130 is applied with a voltage of 0V, the electrical conductive channel will disappear in the channel region 121, and the thin film transistor 100 is in an "off" state. In this embodiment, the gate electrode 130 is made of a material selected from a group consisting of Au, Ag, Al, Cu, Cr, Ti, Mo and alloys thereof. The gate insulating layer 131 is made of a material selected from a group consisting of SiOx, SiNx, SiONx, $Ta_2O_5$, and $HfO_2$.

The nitride conductive layer 140 is formed on upper surfaces of the source region 122 and the drain region 123, and further extends to cover a periphery of an upper surface of the gate insulating layer 131. The nitride conductive layer 140 has a carrier concentration higher than that of the active layer 120. In this embodiment, the nitride conductive layer 140 has a carrier concentration higher than $1\times10^{18}$ $cm^{-3}$. Preferably, the carrier concentration of the nitride conductive layer 140 is $1\times10^{20}$ $cm^{-3}$. The N type nitride semiconductor layer 140 can be amorphous, poly-crystal, or single crystal. In this embodiment, the nitride conductive layer 140 is made of $Al_xIn_yGa_{(1-x-y)}N$ materials wherein the $0\leq x\leq 1$, $0\leq y\leq 1$. The nitride conductive layer 140 can further be doped with silicon, and a doping concentration of silicon is higher than $5\times10^{17}$ $cm^{-3}$.

The source electrode 150 is formed on an upper surface of the nitride conductive layer 140 and located above the source region 122 to electrically connect with the source region 122. The drain electrode 160 is formed on the upper surface of the nitride conductive layer 140 and located above the drain region 123 to electrically connect with the drain region 123. The source electrode 150 and the drain electrode 160 are configured to connect with an external power, thereby providing a driving voltage for the thin film transistor 100. The source electrode 150 and the drain electrode 160 are made of a material selected from a group consisting of Cu, Al, Ni, Mg, Cr, Ti, Mo, W and alloys thereof.

In the thin film transistor 100 described above, the carrier concentration of the nitride conductive layer 140 is higher than that of the active layer 120, which will reduce the contact resistance between the source region 122 and the source electrode 150. Similarly, the nitride conductive layer 140 between the drain electrode 160 and the drain region 123 will also reduce the contact resistance between the drain region 123 and the drain electrode 160. The reduction of the contact resistance will decrease the driving voltage of the thin film transistor 100, and also increase response speed of the thin film transistor 100 to a control signal.

Furthermore, due to a high energy level and a stable chemical activity of the nitride conductive layer 140, the nitride conductive layer 140 can resist the effect of a high temperature or a high humidity in outer environment. Therefore, the nitride conductive layer 140 can prevent the active layer 120 from being affected by moisture or dust in the outer environment.

Figure 2:
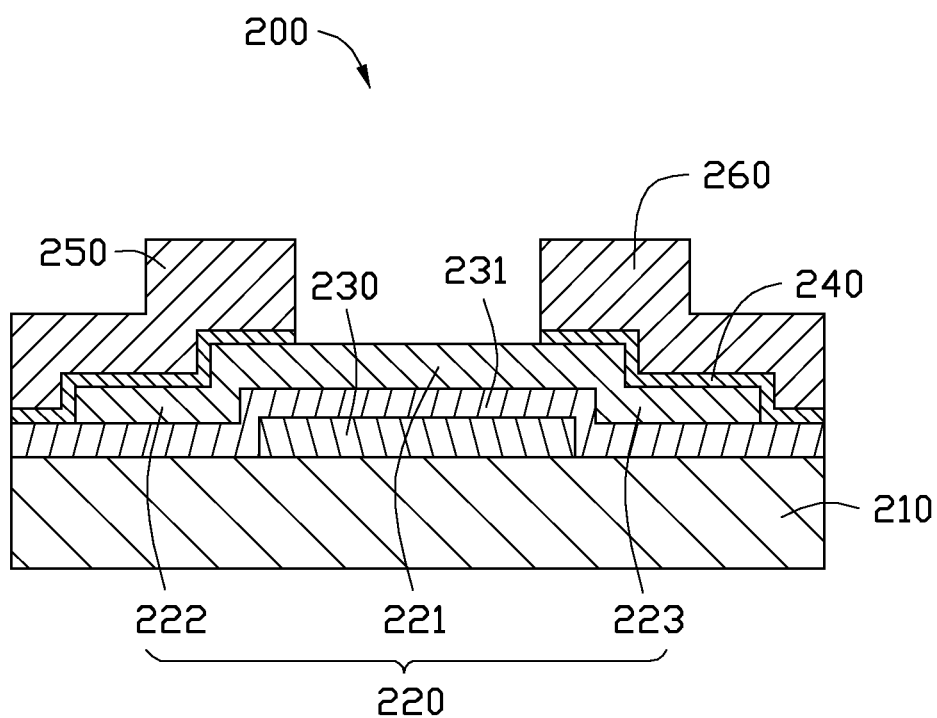
FIG. 2 is a cross-sectional view showing a thin film transistor in accordance with a second embodiment of the present disclosure.

Referring to FIG. 2, a thin film transistor 200 in accordance with a second embodiment includes a substrate 210, an active layer 220, a gate electrode 230, a nitride conductive layer 240, a source electrode 250 and a drain electrode 260. The active layer 220 includes a channel region 221, a source region 222 and the drain 223 located at two lateral portions of the channel region 221. The nitride conductive layer 240 overlaps on the source region 222 and the drain region 223, and further extends to overlap on a periphery of an upper surface of the channel region 221. The source electrode 250 is formed on an upper surface of the nitride conductive layer 240 and located above the source region 222. The drain electrode 260 is formed on the upper surface of the nitride conductive layer 240 and located above the drain region 223. Different from the first embodiment, the gate electrode 230 is located below the channel region 221 and on a center of the upper surface of the substrate 210. The thin film transistor 200 further includes a gate insulating layer 231. The gate insulating layer 231 is formed between the gate electrode 230 and the channel region 221, and further extends to a bottom side of the source electrode 222 and the drain electrode 223 to totally cover an upper surface and a side surface of the gate electrode 230.

Figure 3:
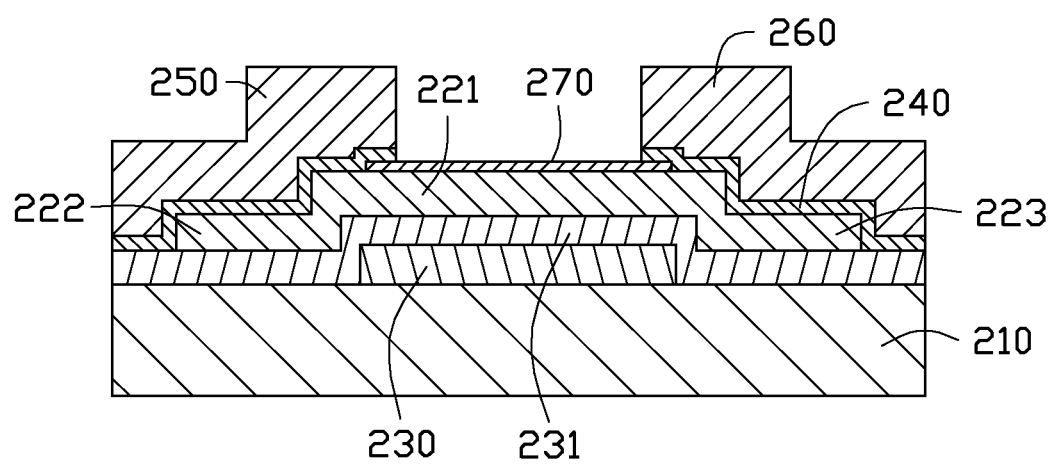
FIG. 3 is a cross-sectional view showing a thin film transistor in accordance with a third embodiment of the present disclosure.

Referring to FIG. 3, a thin film transistor in accordance with a third embodiment is shown which is different from the thin film transistor 200 of FIG. 2 in that the third embodiment further includes an etching block layer 270. The etching block layer 270 locates on a center of the upper surface of the channel region 221 opposite to the gate insulating layer 231. Two lateral ends of the etching block layer 270 are overlapped by the nitride conductive layer 240. The etching block layer 270 is made of an insulating material, which is selected from a group consisting of $SiO_2$, $SiN_x$, and $SiON_x$. In this embodiment, the etching block layer 270 is made of $SiO_2$, which can prevent the channel region 221 from being affecting by moisture or dust.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A thin film transistor comprising:
   a substrate;
   an active layer formed on the substrate, the active layer comprising a channel region, a source region and a drain region located at two lateral portions of the channel region;
   a gate insulating layer formed on the channel region;
   a nitride conductive layer located at the source region and the drain region respectively, the nitride conductive layer having an carrier concentration higher than that of the active layer;
   a gate electrode formed on the gate insulating layer;
   a source electrode formed on the nitride conductive layer and located above the source region; and
   a drain electrode formed on the nitride conductive layer and located above the drain region;
   wherein the nitride conductive layer is made of $Al_xIn_yGa_{(1-x-y)}N$, wherein $0 \leq x \leq 1$, $0 \leq y \leq 1$; and
   wherein a material of the active layer is selected from a group consisting of IGZO, IZO, AZO, GZO, ITO, GTO, ATO, TiOx and ZnO.

2. The thin film transistor of claim 1, wherein the nitride conductive layer has a carrier concentration higher than $1 \times 10^{18}$ $cm^{-3}$.

3. The thin film transistor of claim 1, wherein the nitride conductive layer has a carrier concentration of $1 \times 10^{20}$ $cm^{-3}$.

4. The thin film transistor of claim 1, wherein the nitride conductive layer is doped with silicon, and a doping concentration of silicon is higher than $5 \times 10^{17}$ $cm^{-3}$.

5. The thin film transistor of claim 1, wherein a material of the gate electrode is selected from a group consisting of Au, Ag, Al, Cu, Cr, Ti, Mo and alloys thereof.

6. The thin film transistor of claim 1, wherein materials of the source electrode and the drain electrode are selected from a group consisting of Cu, Al, Ni, Mg, Cr, Ti, Mo, W and alloys thereof.

7. A thin film transistor comprising:
   a substrate;
   a gate electrode formed on an upper surface of the substrate;
   a gate insulating layer formed on the upper surface of the substrate and covering the gate electrode;
   an active layer formed on an upper surface of the gate insulating layer, the active layer comprising a channel region, a source region and a drain region located at two lateral portions of the channel region, the channel region locating above the gate electrode;
   an N type nitride conductive layer formed on an upper surface of the source region and an upper surface of the drain region;
   a source electrode formed on the N type nitride conductive layer and located above the source region; and
   a drain electrode formed on the N type nitride conductive layer and located above the drain region;
   wherein the N type nitride conductive layer is made of $Al_xIn_yGa_{(1-x-y)}N$, wherein $0 \leq x \leq 1$, $0 \leq y \leq 1$; and
   wherein a material of the active layer is selected from a group consisting of IGZO, IZO, AZO, GZO, ITO, GTO, ATO, TiOx and ZnO.

8. The thin film transistor of claim 7, wherein the nitride conductive layer has a carrier concentration higher than $1 \times 10^{18}$ $cm^{-3}$.

9. The thin film transistor of claim 8, wherein the nitride conductive layer has a carrier concentration higher of $1 \times 10^{20}$ $cm^{-3}$.

10. The thin film transistor of claim 7, wherein the nitride conductive layer is doped with silicon, and a doping concentration of silicon is higher than $5 \times 10^{17}$ $cm^{-3}$.

11. The thin film transistor of claim 7, wherein a material of the gate electrode is selected from a group consisting of Au, Ag, Al, Cu, Cr, Ti, Mo and alloys thereof.

12. The thin film transistor of claim 7, wherein materials of the source electrode and the drain electrode are selected from a group consisting of Cu, Al, Ni, Mg, Cr, Ti, Mo, W and alloys thereof.

13. The thin film transistor of claim 7, further comprising an etching block layer formed on an upper surface of the channel region.

14. The thin film transistor of claim 13, wherein two opposite ends of the etching block layer are overlapped by the N type nitride conductive layer.

15. The thin film transistor of claim 13, wherein the etching block layer is made of $SiO_2$.

16. A thin film transistor comprising:

a substrate;

an active layer formed over the substrate, the active layer comprising a channel region, a source region and a drain region located at two lateral portions of the channel region;

a gate electrode located over the substrate and corresponding to the channel region of the active layer;

a gate insulating layer electrically insulating the gate electrode from the active layer;

a nitride conductive layer formed on an upper surface of the source region and an upper surface of the drain region, the nitride conductive layer having an carrier concentration higher than that of the active layer;

a source electrode formed on the nitride conductive layer and located above the source region; and a drain electrode formed on the nitride conductive layer and located above the drain region;

wherein the nitride conductive layer is made of $Al_xIn_yGa_{(1-x-y)}N$, wherein $0 \leq x \leq 1$, $0 \leq y \leq 1$; and wherein a material of the active layer is selected from a group consisting of IGZO, IZO, AZO, GZO, ITO, GTO, ATO, TiOx and ZnO.

\* \* \* \* \*